United States Patent [19]

Hooper

[11] 4,429,418
[45] Jan. 31, 1984

[54] FREQUENCY AGILE SATELLITE RECEIVER

[75] Inventor: Robert L. Hooper, Ocala, Fla.
[73] Assignee: Microdyne Corporation, Ocala, Fla.
[21] Appl. No.: 168,667
[22] Filed: Jul. 11, 1980
[51] Int. Cl.³ .............................................. H04B 1/26
[52] U.S. Cl. ................................... 455/314; 455/207; 455/316
[58] Field of Search ............... 455/313, 314, 316, 318, 455/319, 323, 325, 327, 330, 333, 207, 208, 118, 266, 76

[56] References Cited

U.S. PATENT DOCUMENTS

| | | | |
|---|---|---|---|
| 2,790,072 | 4/1957 | Hugenholtz | 455/76 |
| 2,998,517 | 8/1961 | Beckerich | 455/266 |
| 3,141,135 | 7/1964 | Amlinger | 455/313 |
| 3,324,396 | 6/1967 | Schneider | 455/118 |
| 3,766,481 | 10/1973 | Rodgers | 455/316 |
| 3,931,578 | 1/1976 | Gittinger | 455/314 |
| 4,262,361 | 4/1981 | Hauer | 455/207 |

Primary Examiner—Tommy P. Chin
Attorney, Agent, or Firm—Hall, Myers & Rose

[57] ABSTRACT

A low cost, frequency agile receiver for earth satellite ground stations provides selection of any one of 24 channels available from an RCA synchronous orbit satellite. The tuner of the receiver utilizes mass produced elements including CB synthesizer, divider and PROM chips to control the frequency of a conventional VCO operating at about 500 MHz. Multiplication of the VCO frequency by conventional techniques and in addition the use of a double diode sub-harmonic mixer, low beat local oscillator mixing and of the difference mixer signals (down conversion) permits reduction of 3.72 GHz to 4.18 GHz signals in two mixer stages to 70 MHz IF with sixth-sevenths of the reduction occurring in the first mixer whereby low cost printed circuit filters may be employed to eliminate problems associated with satellite transponder images and adjacent channel IF frequencies produced in the first mixer.

10 Claims, 4 Drawing Figures

FREQUENCY AGILE SATELLITE RECEIVER

RELATED APPLICATION

This application is related to copending application, Ser. No. 168,665, filed on July 11, 1980, in the names of Michael S. Balbes, Charles E. Day, Robert L. Hooper, and Hank S. Lin for Receive Only Earth Satellite Ground Station.

BACKGROUND OF THE INVENTION

The present invention relates to a receive only, earth satellite ground station and more particularly to low cost, tuner and IF sections for frequency agile receivers, said tuner being able to select at least 24 different channels at the command of the user.

As the cost of integrated circuit chips has reduced dramatically and the availability of special function circuits produced for mass markets has increased, the overall costs associated with even highly complex electronic equipment has been reduced such as to open up markets not contemplated just a few years ago. One such market is private earth satellite communications systems having only a few transmit-receive stations and a plurality of receive only stations. Such systems are presently being contemplated by religious organizations and some of the larger industrial concerns for transmitting voice and picture religious services in the former case and instructional materials in the latter case.

Also, as the costs of such receivers are further reduced, the home TV market begins to become attractive and a test of this market is currently being conducted in Canada.

There are presently two types of commercial satellites in orbit which are used for TV relay. They are the Western Union Satellites and the RCA Satellites. While both operate in the same general frequency bands, the Western Union Satellites have twelve transponder bands each 40 MHz wide and each having a center frequency separation of 40 MHz, while the RCA Satellites have 24 transponder bands each 40 MHz wide, but separated by 20 MHz. RCA is able to accomplish this by utilizing frequency re-use or cross polarization. Basically, this configuration consists of 12 transponders having their signals transmited in the vertically polarized mode and 12 horizontally polarized with each adjacent transponder signal being transmitted in the oppositely polarized mode. The system of the present invention is concerned with the RCA system since it provides 24 channels of communications at substantially no additional cost over the Western Union system at least at the receiver.

Continuing with a description of the basics of either system, the satellite receives a nominal 6 GHz signal transmitted from the uplink terminal, translates it to a nominal 4 GHz signal and retransmits it back to the ground in a beam shaped to cover the geographic area of interest, for instance, the United States.

The signal transmitted back to the ground is received by the down link terminal which is the part of the communications chain of interest in the present invention. The down link chain consists primarily of an antenna and one or more low noise amplifiers, receivers and head end modulators.

Various types of antennas are available, i.e. paraboloidal with feed at the focal point, Cassegrain and conical horn. The paraboloid antenna is of primary concern herein although the conical horn may be employed. The receiver in systems of the type under consideration is critical to system performance. Due to the desire for low cost, relatively small antennas must be employed (5 meters or less) and in consequence, the C/N ratios are not as large as may be desirable. Thus, many requirements are placed on the receiver performance and characteristics that would not otherwise be encountered or required in systems providing higher C/N ratios. If the nominal desirable threshold for an FM receiver with a 30–36 MHz IF bandwidth is approximately 10–11 dB C/N, problems are encountered at the edges of the EIRP Footprint where such a ratio is not available. Some manufacturers employ threshold extension techniques to overcome the problem but they increase system complexity and cost and do not overcome the black and white "sparkle" problem resulting from "impulse noise."

SUMMARY OF THE INVENTION

The present invention utilizes various important features to achieve the desired result of a low cost, high performance, frequency agile receiver for use in a receive only earth satellite ground station.

The ground station employs a paraboloidal antenna with the feed, the low noise amplifier (LNA), a frequency agile receiver and head end modulator located at the antenna. The output of the head end modulator provides AM video and FM audio signals which may be applied directly to a TV set over a standard coaxial cable. A receive only, frequency agile earth satellite ground station with which the present invention may be utilized forms the subject matter of copending U.S. patent application Ser. No. 168,665, filed on concurrent date herewith in the name of Balbes, et al for Receiver Only Earth Satellite Ground Station.

The tuner of the present invention is required to reduce the frequency of the incoming signal, 3.72 GHz to 4.1 GHz, to a 70 MHz IF and utilizes several techniques to minimize the maximum frequency required of the local voltage controlled oscillator. As a result, several distinct cost advantages are achieved without loss of system performance. The oscillator operates in a frequency range such that readily available and low cost components may be employed in the oscillator per se. Further, by simple and inexpensive division techniques again due to the relatively low frequency of the local oscillator, a mass produced CB synthesizer chip may be employed for frequency control. Specifically, the local oscillator frequency is divided by 256 and applied as a nominal 2 MHz signal to the synthesizer which produces a d.c. output voltage as a function of the desired channel to be received. The d.c signal controls the nominal 500 MHz local oscillator to produce one of 24 different frequencies equally spaced in the spectrum from 521.49 MHz to 587.143 MHz. This signal is passed through a diode to pump a shorted ¼ wave, wide-line to produce a comb spectrum of uniform energy. The ¼ wave line is followed by a filter for selecting the third line of the comb thus effectively multiplying the local oscillator frequency by three.

The frequency at the output of the filter is in the range of 1564 to 1761 MHz and is thus on the low frequency side of the incoming signals; this type of operation being referred to as low beat operation. The low beat signal is applied to a sub-harmonic first mixer where it is mixed with the r.f. from the LNA. The sub-harmonic mixer employs two oppositely poled diodes whereby to effectively double the local frequency input to the first mixer. Thus, the frequencies of the virtual local signals fall in the range of 3.1 to 3.5 GHz still on the low side of the incoming carriers.

The difference frequency output of the first mixer (down conversion) is selected and thus the first IF frequency falls in the range of 590 to 657 MHz. Since the ultimate output of the mixer stages is to be 70 MHz, sixth-sevenths of the frequency reduction required is accomplished at the first mixer stage. The local oscillator frequency is employed in a low beat, down conversion second mixer to achieve the remaining one-seventh of the required frequency reduction to 70 MHz.

A first relatively broad band (95 MHz) IF printed circuit filter is disposed between the two mixers to provide protection from transponder image frequencies. The first IF frequency was chosen such that all images from the satellite transponders are well outside of the band of frequencies that must be accepted by the first IF filter. The first IF filter, since it must accept a range of center frequencies covering 66 MHz is broad band and thus passes the converted transponder frequencies of the channels on both side of the selected channel. These adjacent channel frequencies are eliminated by narrow band filter(s) following the second mixer.

The aforesaid tuner and IF arrangement permits the use throughout of completely conventional, low cost and many mass produced components without loss of performance. As to the latter point, the techniques employed permit high local oscillator power at the mixers and thus low noise signal output.

It is an object of the present invention to provide a frequency agile tuner for a receiver for use with an earth satellite ground station.

It is another object of the present invention to provide techniques permitting a middle frequency range voltage controlled oscillator to be controlled by a mass produced component with the local oscillator producing a 70 MHz second mixer output as a result of use of low beat down conversion at both mixers in conjunction with multiplication effected by a dual diode subharmonic first mixer and a comb spectrum generator as 2X and 3X multipliers, respectively.

Yet another object of the present invention is to provide transponder image protection at the first IF filter stage and converted transponder carrier protection by the use of a narrow band filter following the second mixer.

It is still another object of the present invention to provide a tuner-IF combination in an earth satellite ground station wherein sufficient signal frequency reduction is accomplished in a first mixer to permit the use of conventional printed circuit filters in the IF stages.

Certain embodiments of this invention will now be described by reference to the accompanying drawings wherein:

DETAILED DESCRIPTION OF THE PREFERRED EMBODIMENTS

Figure 1:
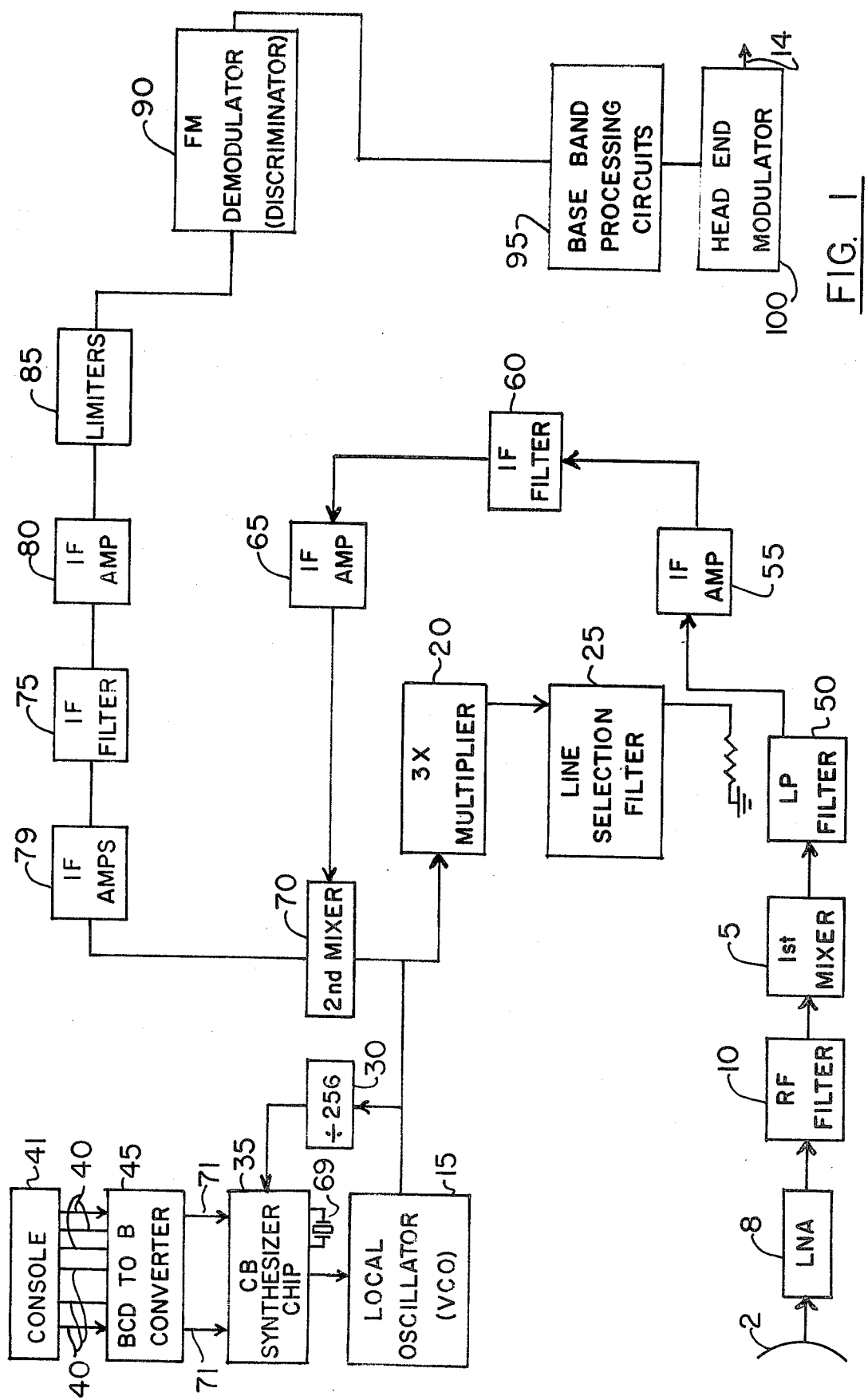
FIG. 1 is a block diagram of the tuner and IF sections of the receiver of the present invention in the environment of the system with which it is preferably to be employed.

Referring now specifically to FIG. 1 of the accompanying drawings, the receiver of the present invention is illustrated in block diagram form.

The receiver comprises a first mixer 5 which receives the r.f. signal, a nominal 3.7 to 4.2 GHz band of frequency modulated frequencies from an antenna 2 via an LNA 8 and an r.f. filter 10.

A second input signal to the first mixer 5 is derived from a basic local oscillator 15 via a 3X multiplier 20, line selection filter 25 and coupler 6. The frequency of the local oscillator 15, which varies from approximately 500 to 600 MHz is applied to a divide-by-256 circuit 30. the circuit 30 is employed to reduce the frequency to a value such that a standard mass produced CB synthesizer chip 35 may be employed for frequency control of the oscillator 15 and therefore control of channel selection. The channel selection from a console 41 is accomplished by applying binary coded decimal signals via leads 40 to a binary coded decimal to binary converter 45 which selects the C.B synthesizer frequency. The d.c. output signal of the synthesizer 35 is applied as the frequency control signal to the oscillator 15.

The output of the first mixer 5 is applied to a low pass filter 50 so as to select the difference frequency output of the mixer. The signal is next passed through an IF amplifier 55, an IF filter 60 and a second IF amplifier 65 to a second mixer 70.

The frequency at the various stages is such that the output signal of the mixer 70 is 70 MHz, the standard television IF frequency which is selected by IF filter 75 after amplification by amplifier 79. The 70 MHz signal goes through a stage of IF amplification 80 and a series of hard limiters 85 to remove all AM from the signals before application to FM demodulation (distriminator) 90. The AM signals produced by the demodulator 90 are separated into audio and video signals by base band processing circuits 95. The audio and video signals are applied to a head end modulator 100 where they are applied to separate carriers for coupling to the video and audio circuits of a conventional TV receiver.

Figure 2A:
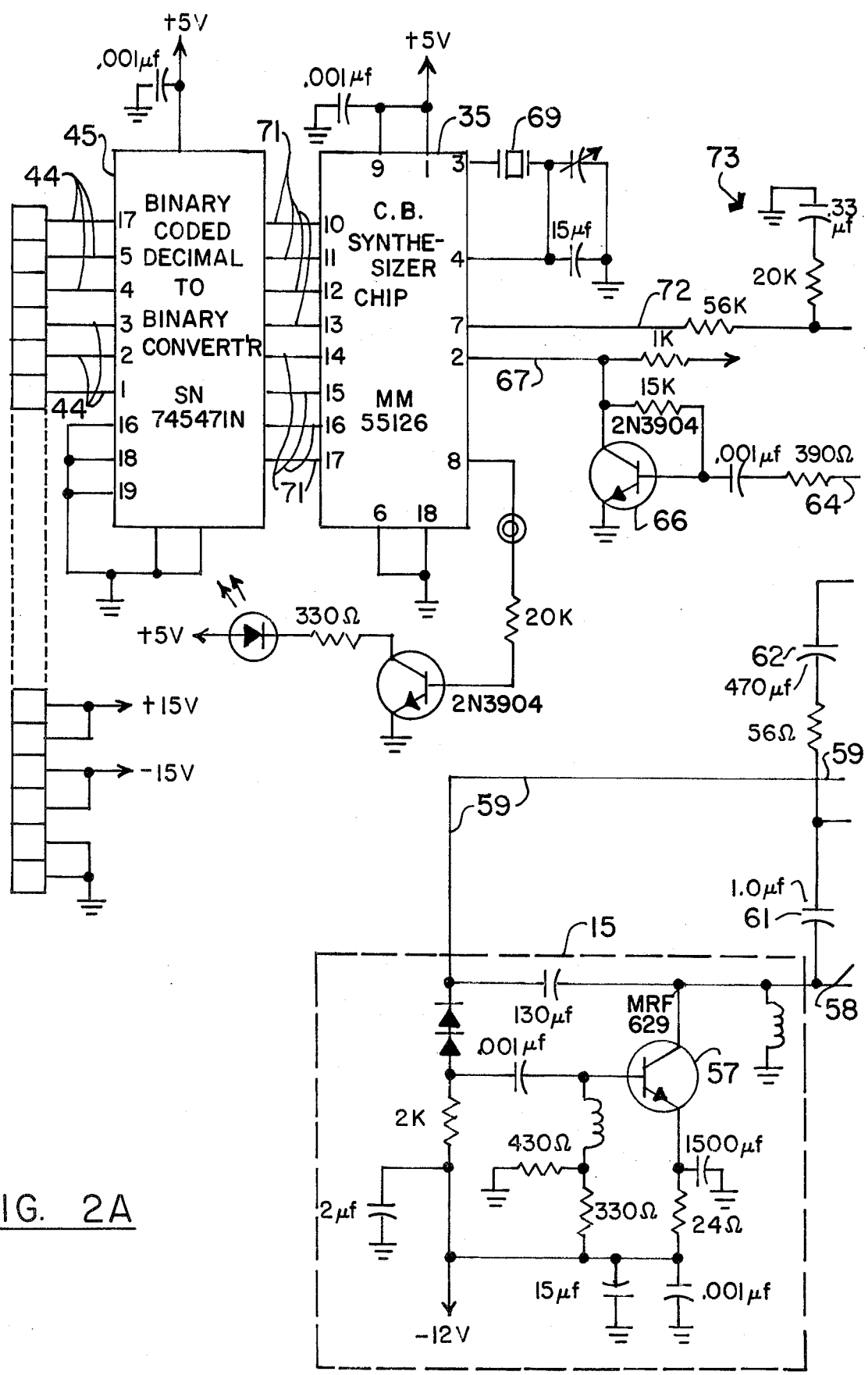
FIGS. 2A, 2B and 2C combine to provide a schematic circuit diagram of the tuner-IF sections of the present invention.
Figure 2B:
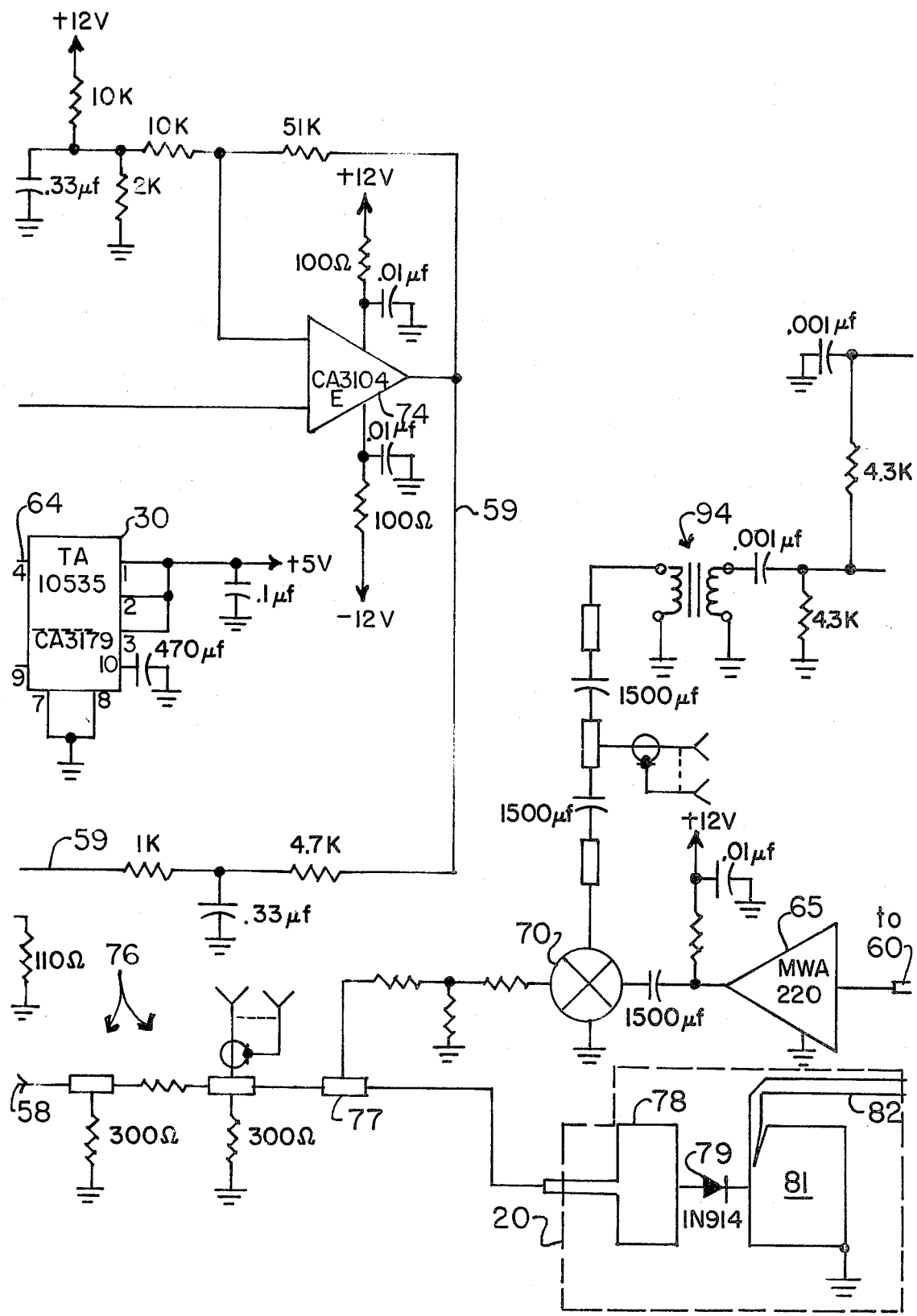
Figure 2C:
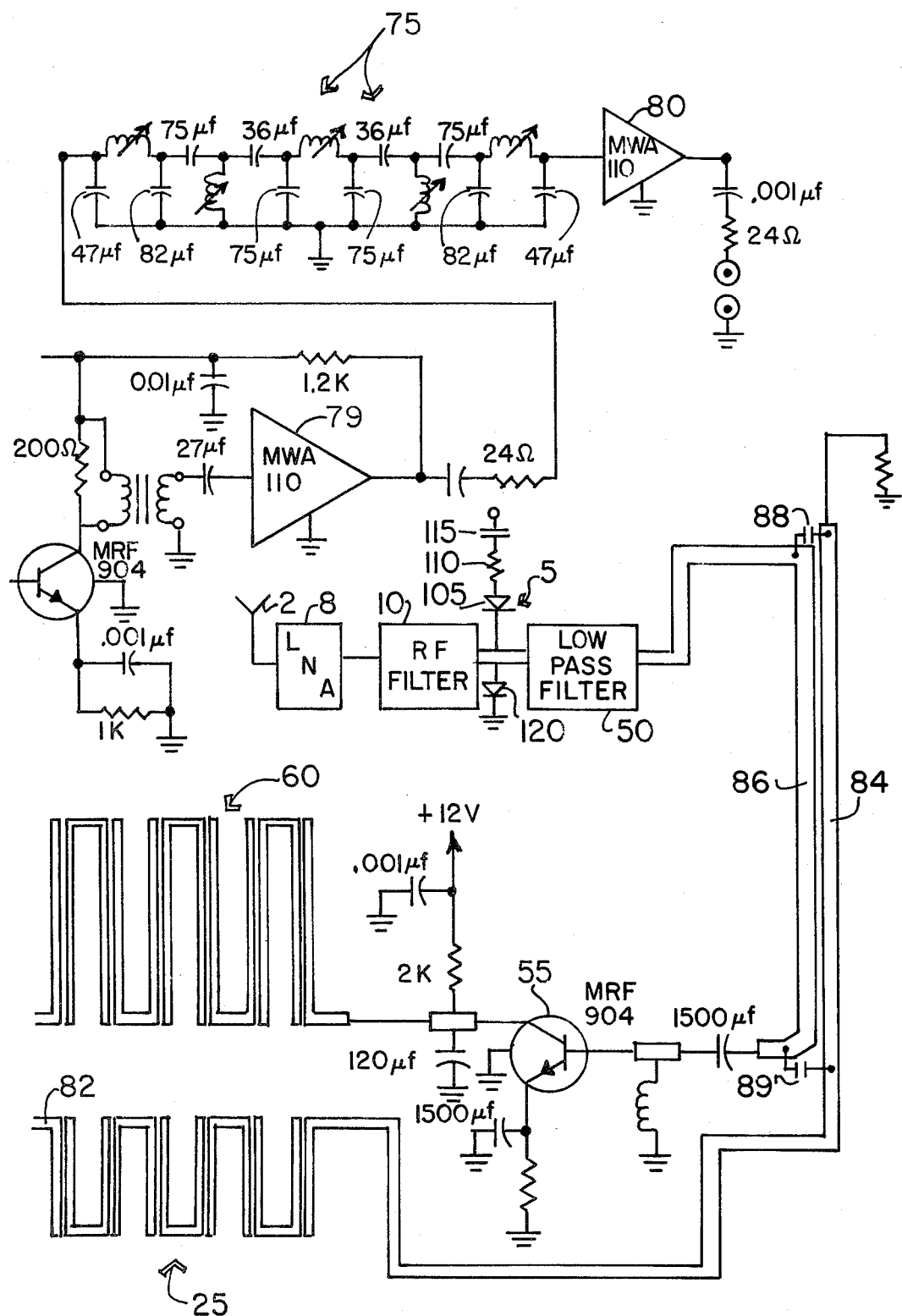

Referring now specifically to FIGS. 2A, 2B and 2C of the accompanying drawings, there is illustrated the schematic diagram of the tuner and IF sections of the receiver. The circuits of FIGS. 2A, 2B and 2C include all of the elements of FIG. 1 except 2, 8, 10, 41 and 80 through 100. The basic local oscillator 15 employs as its active element, an NPN transistor 57, which produces an output signal or frequency on a lead 58 and receives a DC voltage on lead 59 for controlling the frequency of the oscillator. A detailed description of the oscillator is not given, but the components thereof have their circuit values appearing on the drawings as is the case with all components in the drawing. The semi-conductor elements are designated on the drawing by their manufacturer's designation.

The oscillator 15 is intended to cover a range of frequencies from 521.429 MHz to 587.143 MHz. The output of the oscillator appearing on lead 58 is coupled through capacitors 61 and 62 to a divide-by-256 circuit 30. Thus, a signal having a frequency of a nominal 2 MHz appears on output lead 64 of the divider circuit 30. The lead 64 is connected to a grounded emitter NPN transistor 66 providing the input signal frequency on lead 67 to the CB synthesizer chip 35. The synthesizer chip is an MM55126 of National Semi-Conductor and is a standard mass-produced CB synthesizer. Other CB synthesizer chips of other manufacturers may also be utilized. The reference oscillator of the synthesizer is crystal controlled by a crystal 69 connected across pins 3 and 4 of the chip 35 and the voltage is controlled by binary signals appearing on leads generally designated as a group by reference numeral 71, these leads being connected to the pins 10 through 17 of the synthesizer and more specifically to to the programmable divider of the synthesizer.

The DC output control voltage from the synthesizer phase detector appears on pin 7 and is applied to output control lead 72, passes through a second order loop filter 73, amplified by amplifier 74 and applied to the voltage control lead 59 of the oscillator 15. Thus, by appropriate selection of the binary signals appearing on leads 71, the frequency of the oscillator 15 may be readily selected. A single line serial code with appropriate register may also be employed. The coded decimal signal appearing on leads 71 is generated by converter 45; Texas Instruments PROM SN745471, which is mass-produced for the automobile industry and is programmed to convert binary coded decimals to binary signals. The program (signal conversion list) for the PROM is listed at the end of this application. The input signals to the converter 45 appear on leads 40 as previously indicated.

It is thus seen that a 500 MHz oscillator 15 is controlled by a mass-produced CB synthesizer of totally conventional design and of quite low cost. Since the oscillator 15 is in the 500 to 600 MHz range, it also is comprised of totally conventional circuits and is of relatively low cost. Further, the oscillator generates about a +20 dBM level signal sufficient to drive the subsequent stages at sufficient power to maintain an acceptable signal-to-noise ratio throughout the system.

The signal on lead 58 is passed through a 3 dB pad generally designated by the reference numeral 76 and a further pad 77 to a 50 ohm; low input impedance, wide line 78. A part of the signal passed by the pad 76 is taken off at the pad 77 to be applied to the second mixer 70.

The wide line 78 feeds a diode 79 which in turn pumps a shorted, quarter wave, wide line 81. The shorted line is used so that when pumped at a low frequency, a very narrow sharp pulse is obtained. Due to the use of wide lines, the circuit is of low impedance so that the shorted quarter wave line produces a quite even energy distribution over a relatively wide band.

The energy appearing on output line 82 of the shorted line 81 has a comb line spectrum with the space between the lines being equal to the frequency, at any given time, of the basic oscillator 15. The filter 25 selects the line having a frequency three times that of the frequency of the basic oscillator and thus the diode 79, quarter wave line 81, and filter 25 in combination, constitute a low impedance relatively wide band multiplier stepping up the local oscillator frequency from the range of 500 to 600 MHz to 1500 to 1800 MHz. The particular arrangement, although being somewhat inefficient so far as energy is concerned, is desirable and is utilized because of the relatively constant power provided across the band of the comb and the fact that the oscillator being a relatively low frequency oscillator readily provides sufficient energy to accommodate the losses of the multiplier.

The output signal of the filter 25 appears on lead 84 as a signal, hereinafter referred to as the LO signal; the signal from the oscillator 15 being hereinafter referred to as the BO signal.

The LO signal appearing on lead 84 is coupled to a parallel extending lead 86 which is connected via a low pass filter 50 to mixer 5 where it is mixed with the RF signal received from the antenna 2 via low noise amplifier 8 and RF filter 10 whereby the incoming RF and the LO signal are mixed in the sub-harmonic mixer 5. It should be noted that the lines 84 and 86 are coupled so as to constitute a backward wave coupler including coupling capacitors 88 and 89. In consequence, the LO signal is coupled to the lead 86 and thence through the low pass filter 50 to the mixer 5.

The sub-harmonic mixer 5 constitutes a pair of diodes; a diode 120 having its cathode grounded and a diode 105 having its plate connected to a positive voltage source through a resistor 110 and an a.c. by-pass capacitor 115. The two diodes in the mixer conduct on alternate half cycles; diode 105 conducting on a positive half cycle and diode 110 conducting on the negative half cycle of the signal. In effect, therefore, the mixer is made to appear as if it is being driven at twice the frequency appearing on the lead 86; that is, nominally at 3–4 GHz. Thus, the combination of the 3X multiplier and the use of the two diodes in the sub-harmonic mixer has the effect of multiplying by six. By this approach which utilizes low cost, readily available components, the conventional 500 MHz oscillator is now made to appear as if it were a nominal 3–4 GHz oscillator.

The output from the sub-harmonic mixer 5 also appears on the lead 86 and is coupled to a first IF amplifier 55. The frequency appearing at the various points in the circuit are listed in Table I:

TABLE I

| CHANNEL | RF | OSC(BO) | LO | 1st IF | 2nd IF |
|---|---|---|---|---|---|
| | | IN MHz | | | |
| 1 | 3720 | 521,429 | 1564.287 | 591.429 | 70 |
| 2 | 3740 | 524,286 | 1572.858 | 594.286 | 70 |
| 3 | 3760 | 527.143 | 1581.429 | 597.143 | 70 |
| 4 | 3780 | 530.000 | 1590.000 | 600.000 | 70 |
| 5 | 3800 | 532.857 | 1598.571 | 602.857 | 70 |
| 6 | 3820 | 535.714 | 1607.142 | 605.714 | 70 |
| 7 | 3840 | 538.571 | 1615.713 | 608.571 | 70 |
| 8 | 3860 | 541.429 | 1624.287 | 611.429 | 70 |
| 9 | 3880 | 544.287 | 1632.861 | 614.286 | 70 |
| 10 | 3900 | 547.143 | 1641.429 | 617.143 | 70 |
| 11 | 3920 | 550.000 | 1650.000 | 620.000 | 70 |
| 12 | 3940 | 552.857 | 1658.571 | 622.857 | 70 |
| 13 | 3960 | 555.714 | 1667.142 | 625.714 | 70 |
| 14 | 3980 | 558.571 | 1675.713 | 628.571 | 70 |
| 15 | 4000 | 561.429 | 1684.287 | 631.429 | 70 |
| 16 | 4020 | 564.286 | 1692.858 | 634.286 | 70 |
| 17 | 4040 | 567.143 | 1701.429 | 637.143 | 70 |
| 18 | 4060 | 570.000 | 1710.000 | 640.000 | 70 |
| 19 | 4080 | 572.857 | 1718.571 | 642.857 | 70 |
| 20 | 4100 | 575.714 | 1727.142 | 645.714 | 70 |
| 21 | 4120 | 578.571 | 1735.713 | 648.571 | 70 |
| 22 | 4140 | 581.429 | 1744.287 | 651.429 | 70 |
| 23 | 4160 | 584.286 | 1752.858 | 654.286 | 70 |
| 24 | 4180 | 587.143 | 1761.429 | 657.143 | 70 |

The RF frequencies are, of course, set by international standards, these being the frequencies received from the satellite. The channel assigned to each of these frequencies is indicated under the channel number with the BO or basic oscillator frequency appearing under the heading OSC(BO). The 3X signal appears under the LO designation and the first and second IF frequencies appear under the corresponding headings. All frequencies are in megahertz.

It will be noted that, for instance, for Channel 1, the RF frequency is 3720 MHz, the BO signal is 521.429 MHz and the LO signal is 1564.289 MHz. The effective value of the LO signal in the sub-harmonic oscillator is 3128.587 MHz which when subtracted from the 3720 MHz provides the first IF frequency, i.e. the frequency applied to the IF amplifier 55. The remainder of the frequency assignments are readily apparent from Table I. The signal produced by the amplifier 55 is applied to IF filter 60; the output of the filter being applied to a second IF amplifier 65. The output of the amplifier 65 is applied to the second mixer 70. Referring again to Table 1, the IF frequency, for instance, 591.429 MHz for Channel 1, is mixed with the BO signal at 521.429 MHz to produce the standard 70 MHz, second IF signal of conventional systems.

There are two important features of the system thus far described which require additional emphasis. It will be noted that in both mixers the local oscillator frequency is below the r.f. or IF signal with which it is to be mixed, i.e. low band. Further, the difference frequency output is employed from each mixer, down conversion. The techniques thus employed permit the relatively low frequency oscillator 15 to fully control the mixing functions for reducing the 3.72 to 4.18 GHz RF to a 70 megacycle second IF in only two stages, a quite inexpensive arrangement, particularly in view of the completely conventional components utilized to accomplish this end result.

Referring again to the filter 60, this filter must pass signals in the band spread from 591.429 MHz to 657.143 MHz plus the band width of the information. Thus the filters 60 must have a band width of about 95 MHz. In view of the wide band width required of the filter 60, a unique approach is required to prevent image frequencies of the satellite transponders from being passed by the filter. This approach is to accomplish sixth-sevenths of the down conversion at the first mixer so that the first IF frequency is well outside of the range of image frequencies of the transponder. As previously indicated, this large step down is accomplished by the 3X multiplier, the dual diode sub-harmonic mixer and low beat, down conversion.

It should be noted that, also as a result of the large frequency reduction at the first mixer, a printed circuit filter 60 may be utilized, a considerable cost saving relative to first IF filters operating in the gigahertz range as in prior art receivers.

The signals passed by filter 60 are amplified by amplifier 65 and passed to the second mixer 70 where they are mixed with the BO signal to produce a 70 MHz second IF signal. The output of the mixer 70 passes through an IF amplifier 79 and thence through a narrow band, 30 MHz, filter 75 to limiters 85 which form no part of the present invention and are conventional in design.

A well-defined sharp cut-off filter is required as the filter 75 in view of the broad band of the filter 60 which permits several first IF frequencies to pass. As an example, if Channel 11 is selected, the effective local frequency applied to the first mixer is 3300 MHz. The IF frequencies produced by Channels 9, 11 and 13 are at 580 MHz, 620 MHz and 660 MHz. Channels 10 and 12 are of the wrong polarization and are blocked.

The signals from Channels 9 and 13 lie only slightly out of the band of the filter 60, only 11.429 MHz for Channel 9 and 2.857 MHz for Channel 13. Movement of the selected channel either up or down will cause one of the adjacent channel signals to fall squarely in the band of filter 60. Thus, the filter 75 must have a narrow well-defined band in the instant case, 30 MHz, to prevent severe interference with the channel selected.

Returning to a detailed description of the drawing, the output signal from the second mixer 70 is applied via a transformer 94 to an amplifier stage generally designated by reference numeral 96. The IF amplifier stage 96 sets the noise figure for the output of the tuner section, in conjunction, of course, with the noise and gain of the other amplifiers. The first IF amplifier 55 has about a 2 dB noise figure and about a 10 dB gain. The filters have about a 3 dB insertion loss so that the gain at the first IF amplifier 55 is sufficient to mask the insertion loss of the filter. This filter is followed by more gain at the amplifier 65 to mask a 7 dB noise figure of the second mixer 70. The IF amplifier 96 provides 30 dB of gain against a 10 dB noise figure so that the signal to noise ratio at the output of the tuner section which is applied to the IF filter 75 is more than adequate to provide a very low noise signal to the remainder of the system.

The filter 75 constitutes an alternating series of PI and T filters, having a 70 MHz IF center frequency and a 30 MHz band width. The filter has a 50 ohm input and output impedance and the output of the filter is applied to a further IF amplifier 80 providing an additional 14 dB of gain. The output of the amplifier 80 is applied to limiters 85 and thence to the remaining system for appropriate processing.

Many of the specific components employed in the circuit may be varied. Different transistors; different CB, divider and PROM chips and different VCO circuits may be employed without changing the spirit or scope of the invention. The features of the invention which are important to the realization of a low cost frequency agile receiver are the various interrelationships of the concepts of a VCO operated at some intermediate frequency with frequency multiplication and low beat, down conversion to reduce received frequencies by use of a single oscillator to a standard IF frequency with a large percentage of the conversion occuring at a first mixer so that inexpensive but effective printed circuit filters may be employed. Specifically, these features permit the objects of the invention to be achieved by the use of conventional printed circuit boards mounted or formed directly on base boards fabricated by conventional techniques and having conventional active and passive components.

The frequencies specified hereinabove except for those established for the satellite transponder transmission, are a matter of choice in so far as exact designations are concerned. The present invention is not concerned with exact frequency assignments but is concerned with the concepts of novel local oscillator frequency multiplication, low beat, down conversion to permit the use of a single relatively low frequency local oscillator to achieve significant frequency reduction in a single mixer whereby, among other desirable results, effective filtering may be accomplished with low cost printed circuit filters.

Further, most of the exact circuits illustrated are not intended to be restrictive; these being shown in FIGS. 2A–2C only for the purpose of setting forth the best mode of operation at the time of writing.

The program list for the converter 45 is set forth in Table II below.

| DUAL CONVERSION PROM | | | |
|---|---|---|---|
| BCD CODE ADDRESS | DATA | ÷ | ÷ IN BIN. |
| 00 | 6d | 365 | 101101101 |
| 01 | 6d | 365 | 101101101 |
| 02 | 6f | 367 | 101101111 |
| 03 | 71 | 369 | 101110001 |
| 04 | 73 | 371 | 101110011 |
| 05 | 75 | 373 | 101110101 |
| 06 | 77 | 375 | 101110111 |
| 07 | 79 | 377 | 101111001 |
| 08 | 7B | 379 | 101111011 |
| 09 | 7d | 381 | 101111101 |
| 10 | 7f | 383 | 101111111 |
| 11 | 81 | 385 | 110000001 |
| 12 | 83 | 387 | 110000011 |
| 13 | 85 | 389 | 110000101 |
| 14 | 87 | 391 | 110000111 |
| 15 | 89 | 393 | 110001001 |
| 16 | 8B | 395 | 110001011 |
| 17 | 8d | 397 | 110001101 |
| 18 | 8f | 399 | 110001111 |
| 19 | 91 | 401 | 110010001 |
| 20 | 93 | 403 | 110010011 |
| 21 | 95 | 405 | 110010101 |
| 22 | 97 | 407 | 110010111 |
| 23 | 99 | 409 | 110011001 |
| 24 | 9B | 411 | 110011011 |
| 25 | 9B | 411 | 110011011 |
| 26 | 9B | 411 | 110011011 |
| 27 | 9B | 411 | 110011011 |
| 28 | 9B | 411 | 110011011 |
| 29 | 9B | 411 | 110011011 |

Once given the above disclosure, many other features, modifications and improvements will become apparent to the skilled artisan. Such other modifications, features and improvements are, therefore, considered a part of this invention, the scope of which is to be determined by the following claims.

I claim:

1. A frequency agile receiver having a tunable voltage controlled oscillator operating in a range permitting use of conventional printed circuit boards and standard active and passive components mounted thereon, comprising
    means for multiplying the frequency of the output signal from said oscillator to produce a frequency multiplied output signal,
    a first mixer
    means for applying said frequency multiplied output signal and an information modulated received signal to said first mixer,
    the frequency of said frequency multiplied output signal being less than the frequency of said received signal to produce first signals of the sum and difference frequencies of said received signals and said frequency multiplied output signal,
    said first mixer being a dual diode subharmonic mixer whereby said frequency multiplied output signal is further multiplied in said first mixer by a factor of two,
    a second mixer,
    means for applying said frequency multiplied output signal and said first difference signal to said second mixer to produce second signals at the sum and difference frequencies of said frequency multiplied output signal and said first difference signal,
    said frequency multiplied output signal having a frequency less than said first difference signal, and
    means for selecting said difference signal to said second signals.
2. The apparatus according to claim 1 wherein said means for multiplying comprises
    a wide line,
    a one-quarter wave shorted wide line,
    a diode extending between one end of said wide line and said one-quarter wave wide line,
    means for applying said frequency multiplied output signal to said wide line at an end remote from said diode, and
    a first narrow band filter for selecting from said one-quarter wave wide line a predetermined multiple of the frequency of said frequency multiplied output signal.
3. The apparatus according to claim 2 wherein said first narrow band filter selects a frequency three times the frequency of said frequency multiplied output signal.
4. The apparatus according to claim 1 further comprising a fixed frequency wide band printed circuit filter electrically connected between said first and second mixers.
5. The apparatus according to claim 1 further comprising a wide band printed circuit filter disposed between said first and second mixers,
    said wide band filter having a band width approximately equal to the full band width of said first difference signals to be received plus the band width of information signals modulating said received signal.
6. The apparatus according to claim 5 wherein said means for selecting said second difference signal has a band width approximately equal to the band width of said information signals.
7. A dual mixer arrangement comprising
    means for producing a first signal;
    means for multiplying said first signal to produce a second signal;
    first means for mixing said second signal with a third signal of higher frequency than said second signal to produce sum and difference fourth signals;
    second means for mixing said first signal with said difference signal of said fourth signal;
    said first signal being of a lower frequency than said difference frequency of said fourth signal;
    said means for multiplying comprising a wide line;
    a one-quarter wave shorted wide line;
    a diode extending between one end of said wide line and said one-quarter wave wide line;
    means for applying said output signal to the other end of said wide line remote from said diode, and
    a first narrow band filter for selecting from said one-quarter wave wide line a predetermined multiple of the frequency of said output signal.
8. The apparatus according to claim 7 wherein said first means for mixing multiplies said second signal by a factor of two.
9. The apparatus according to claim 7 or claim 8 wherein said means for multiplying multiplies said first signal by a factor of three.
10. The apparatus according to claim 7 further comprising a coupler coupling the output signal of said first narrow band filter between said first and second mixers for application to said first mixer, and
    filter means between said coupler and said second mixer preventing passage of said output signal to said second mixer.

* * * * *